United States Patent [19]
Choi

[11] Patent Number: 5,871,782
[45] Date of Patent: Feb. 16, 1999

[54] TRANSFER MOLDING APPARATUS HAVING LAMINATED CHASE BLOCK

[75] Inventor: Sihn Choi, Choongcheongbuk-Do, Rep. of Korea

[73] Assignee: LG Semicon Co. Ltd., Cheongju, Rep. of Korea

[21] Appl. No.: 756,365

[22] Filed: Nov. 26, 1996

[30]    Foreign Application Priority Data

Dec. 30, 1995   [KR]   Rep. of Korea ................... 68654/1995

[51] Int. Cl.⁶ .................................................. B29C 45/02
[52] U.S. Cl. ................... 425/116; 425/129.1; 425/451.4; 425/444; 425/544; 425/556; 425/588; 425/DIG. 5; 425/DIG. 28; 264/272.17; 249/67
[58] Field of Search ........................ 264/272.17; 425/116, 425/129.1, 544, DIG. 228, 556, 444, 588, 451.4, DIG. 5; 249/67, 68

[56]    References Cited

U.S. PATENT DOCUMENTS

| | | | |
|---|---|---|---|
| 2,409,725 | 10/1946 | Whitmore et al. | 425/585 |
| 3,824,062 | 7/1974 | Farrell | 425/451 |
| 3,924,993 | 12/1975 | Terrell | 425/DIG. 5 |
| 4,252,293 | 2/1981 | Daley | 249/68 |
| 5,366,368 | 11/1994 | Jang | 425/544 |

FOREIGN PATENT DOCUMENTS

| | | | |
|---|---|---|---|
| 1191663 | 8/1985 | Canada | 425/116 |
| 61-214439 | 9/1986 | Japan | 425/129.1 |
| 62-19418 | 1/1987 | Japan | 425/544 |
| 1117038 | 5/1989 | Japan | 425/444 |
| 1181538 | 7/1989 | Japan | 264/272.17 |
| 413047 | 6/1974 | U.S.S.R. | 425/444 |
| 579157 | 11/1977 | U.S.S.R. | 249/68 |

*Primary Examiner*—Jay H. Woo
*Assistant Examiner*—Robert Hopkins
*Attorney, Agent, or Firm*—Fleshner & Kim

[57]    ABSTRACT

An improved transfer molding apparatus has a laminated chase block with many sets, which is capable of fabricating a plurality of semiconductor packages. The apparatus includes an upper plate and a movable lower plate and a plurality of posts disposed between the upper and lower plates. A plurality of laminated chase blocks is fixed to the posts. A plurality of ejecting means are disposed at one side of the chase blocks and supply means concurrently supplies a molding compound to the plurality of chase blocks.

22 Claims, 6 Drawing Sheets

TRANSFER MOLDING APPARATUS HAVING LAMINATED CHASE BLOCK

TECHNICAL FIELD

The present invention relates to a transfer molding apparatus, and more particularly, to an improved transfer molding apparatus having laminable chase blocks.

BACKGROUND ART

FIG. 1 shows a side view of a conventional transfer molding apparatus. There are provided lower and upper plates 1 and 2. The lower plate 1 is upwardly and downwardly movable. Reference numeral 4 denotes a post of the lower and upper plates 1 and 2. An upper and lower master dies 3 and 3' having a heating system 9 are disposed at the lower and upper plates 1 and 2, respectively.

A chase block 20, into which an epoxy molding compound is cured therein in order for a semiconductor package to be formed and has a plurality of cavities 22 with a semiconductor package-shaped body, is disposed in the upper and lower master dies 3. Reference numerals 11 and 12 denote a transfer ram and a hydraulic cylinder, respectively.

The chase block 20 is disposed at a lower master die 3'. An upper master die 3 has the same chase block symmetrically spaced apart from the chase block 20 disposed at the lower master die 3'. The upper and lower chase blocks 20 form a semiconductor package as one set.

As shown in FIGS. 2 and 3, first, second and third plates 25, 23, and 27 are laminated from the upper portion in order. A cavity 22 is formed on the upper surface of the first plate 25 in a half form of a semiconductor package body 30 to be formed. A runner 21 extended from the cavity 22 is formed, into which an epoxy molding compound flows.

The second plate 23 is referred to as an ejecting plate. It is disposed between the first plate 25 and the third plate 27 and is movable upwardly and downwardly. A plurality of ejecting pins 24 are threaded with the first and second plates 25 and 23. The upper portions of the ejecting pins 24 communicate with the cavity 22 of the first plate 25 and the runner 21. The ejecting pins 24 are protrudely extended beyond the upper surface of the cavity 22 and the runner 21 in cooperation with the up and down movements of the second plate 23, so that the molded semiconductor package can be ejected to the outside thereby.

First, the heater 9 is disposed into the upper and lower master dies 3 of the lower and upper plates 1 and 2 and is heated up to a proper molding temperature. When the molding work temperature is made, the lead frame is loaded on the lower chase block 20. The lower master die 3' ascends and then clamps with the upper master die 3.

Thereafter, the tablet of the epoxy molding compound (EMC) is introduced into the through hole formed within the upper and lower master dies 3 and 3'. The EMC having a predetermined pressure in a gel form is supplied into the cavity 22 in cooperation with the transfer ram 11. When the EMC filled in the cavity 22 of the chase block 20 is substantially cured, the ejecting pins 24 cause the molded semiconductor package 30 to escape to the outside in cooperation with the ejecting plate 23. The ejecting pins 24 are driven by the ejecting plate 23 upwardly and downwardly movable in cooperation with the hydraulic pressure.

However, since the conventional transfer molding apparatus is directed to molding the semiconductor package using one molding structure of the upper and lower master dies, the number of semiconductor packages is limited. In addition, after the molding is finished, the ejecting plates should be driven so as to eject the molded semiconductor package from the chase block, so it is inconvenient.

Meanwhile, FIG. 4 shows the multi-port type molding apparatus, and FIG. 5 shows the chase block of the molding apparatus. As shown therein, the chase block 20*a* has a plurality of cavities 22*a* (in the drawings, eight cavities are shown) which are linked by the runner 21. This method is directed to using a tiny tablet and a plurality of transfer rams 17, and the runner is short. In this method, since the upper and lower master dies form one molding structure and then mold the semiconductor package, the number of the semiconductor packages which are fabricated by one molding process is limited, so that mass production is very difficult.

DISCLOSURE OF THE INVENTION

The present invention may be achieved at least in part by a transformer molding apparatus, comprising: a first plate and a movable second plate; a plurality of posts disposed between the first and movable second plates; a plurality of chase blocks fixed to the posts, the chase blocks adapted to be laminated by the movable second plate; a plurality of ejecting means disposed at one side of the plurality of chase blocks; and supply means for concurrently supplying a molding compound to the plurality of chase blocks.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 6A and 6B are schematic views showing a semiconductor package transfer molding apparatus according to the present invention, of which:

FIG. 6A is a view showing a state before the apparatus is operated; and

FIG. 6B is a view showing a state when the apparatus is in operation;

FIGS. 11A and 11B are views showing the operation state of a molding apparatus according to the present invention, of which:

FIG. 11A is a view showing an open state; and

FIG. 11B is a view showing a clamping state.

BEST MODE FOR CARRYING OUT THE INVENTION

Figure 1:
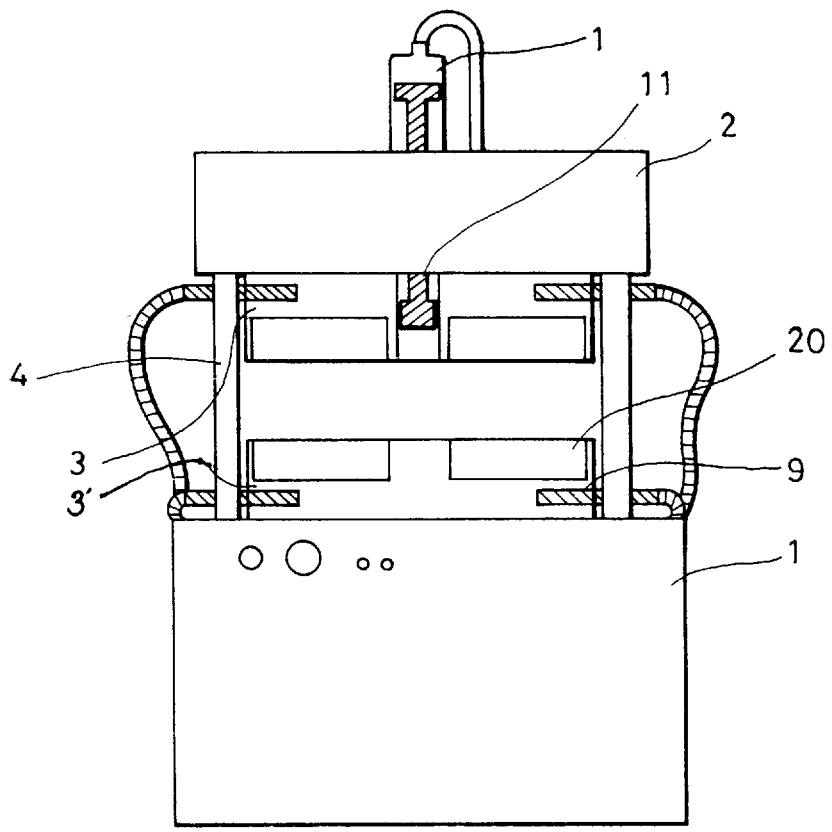
FIG. 1 is a schematic side view showing a conventional semiconductor package transfer molding apparatus.
Figure 2:
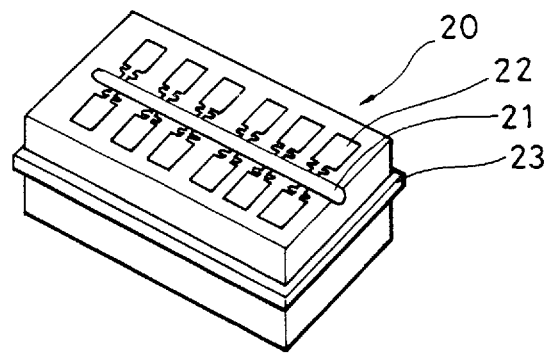
FIG. 2 is a perspective view showing a chase block of a molding apparatus of FIG. 1.
Figure 3:
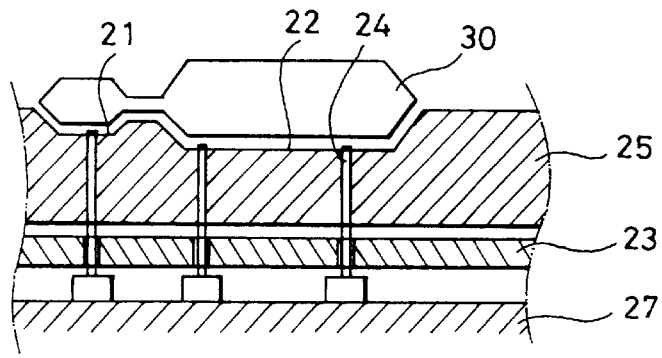
FIG. 3 is a cross-sectional view showing a chase block of FIG. 2.
Figure 4:
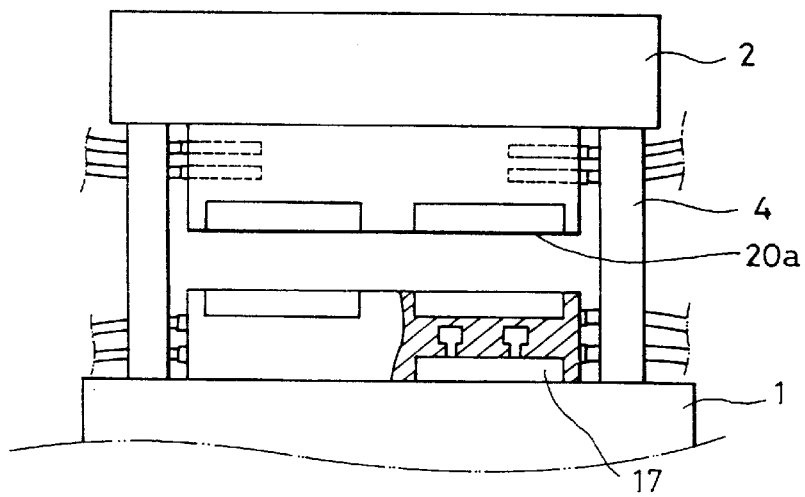
FIG. 4 is a view showing a conventional multi-port type transfer molding apparatus.
Figure 5:
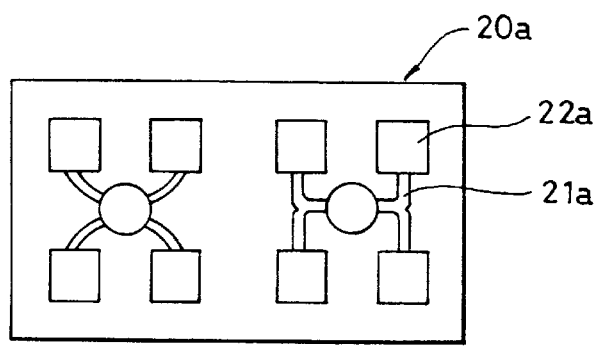
FIG. 5 is a top view showing a conventional multi-port type chase block.
Figure 6A:
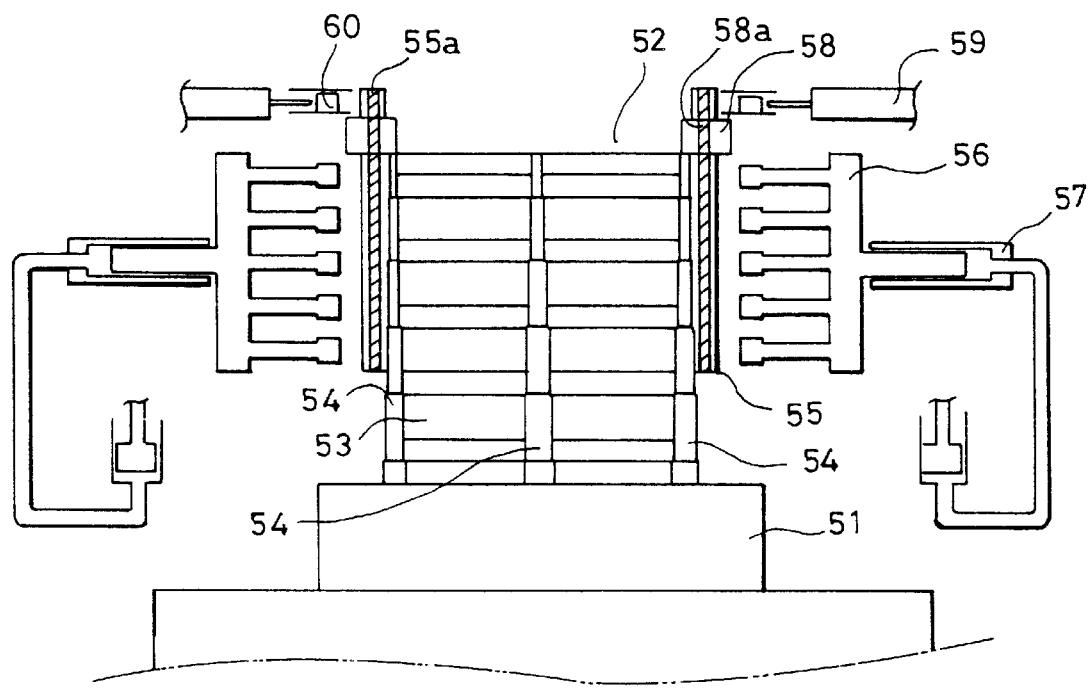

As shown in FIG. 6A, the transfer molding apparatus according to the present invention includes lower and upper plates 51 and 52, a plurality of posts 54 disposed between the lower and upper plates 51 and 52, and a plurality of laminated chase blocks 53 of which both sides are welded to the sides of the posts 54. The lower plate 51 is upwardly and downwardly movable. Each of the posts 54 includes a plurality of spaced-apart knobs. Each knob can be inserted into a corresponding knob for a connection.

Reference numeral 58 denotes a driving motor disposed at a predetermined portion of the upper plate 52. The driving motor 58 has a gear 58a. A tablet loader 55 is upwardly and downwardly movable in cooperation with the driving motor 58. Reference numeral 55a denotes a gear groove. Reference numeral 56 denotes a multi-ram assembly, and 57 denotes a hydraulic set for driving the ram assembly 56. The tablet loader 55 includes a solid molding compound 60 by the hydraulic cylinder 59. The tablet loader 55 serves as a supplying means for supplying the molding compound in the chase blocks along with the multi-assembly.

Figure 6B:
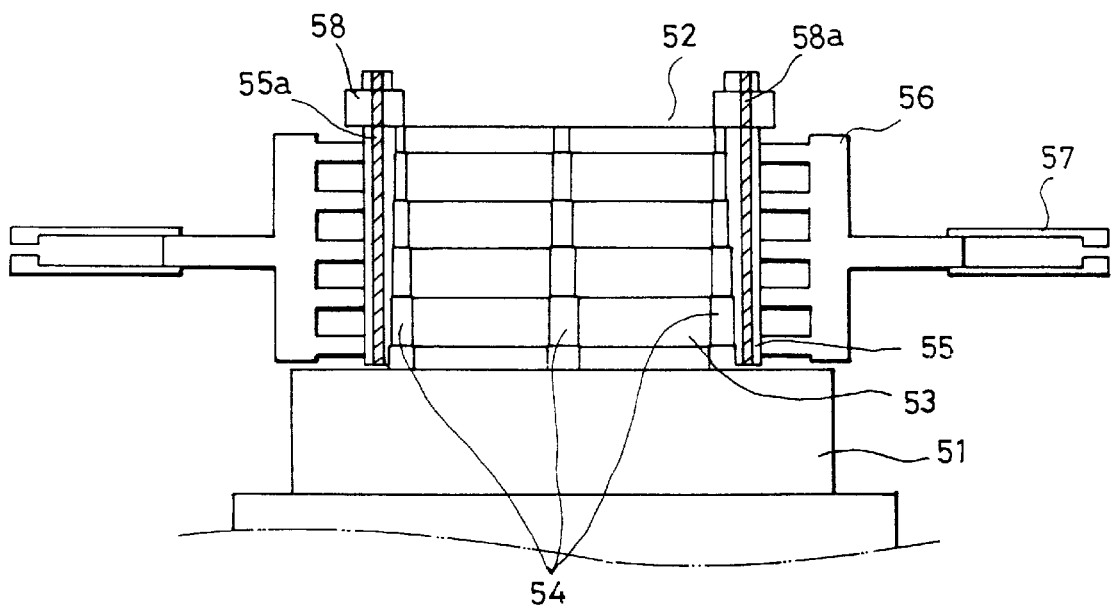

FIG. 6B shows a clamping state of the chase block. The posts 54 are composed of the knobs which are inserted into one another, so that the chase blocks 53 come into contact with one another. The tablet loader 55 to which the tablet 60 is attached are positioned at both sides of the chase blocks 53. In addition, the end of the ram assembly 56 causes the tablet to flow into the chase blocks 53 through the interior of the tablet loader 55.

Figure 7:
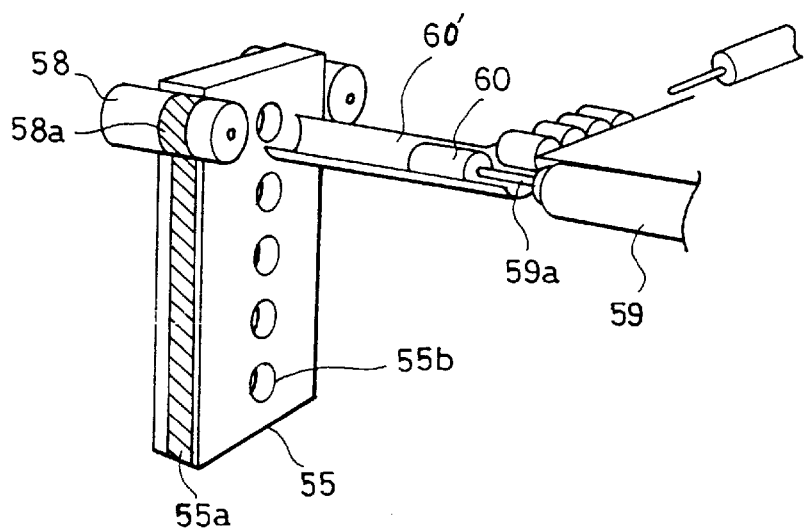
FIG. 7 is a perspective view showing the upper portion of a tablet loader of a molding apparatus of FIG. 6 according to the present invention.

The placing process of the tablet 60 will now be described with reference to FIG. 7. The tablet loader 55 is intermeshed with the gear 58a of the driving motor 58 disposed at the chase blocks 53 through the gear groove 55a formed at the side of the same. The tablet loader 55 is upwardly and downwardly movable. The tablet loader 55 includes a plurality of holes 55b spaced-apart at a regular interval. The piston 59a of the hydraulic cylinder 59 pushes the tablet 60 disposed at a guide 60' in order for the tablet 60 to be introduced into the hole 55b.

Figure 8:
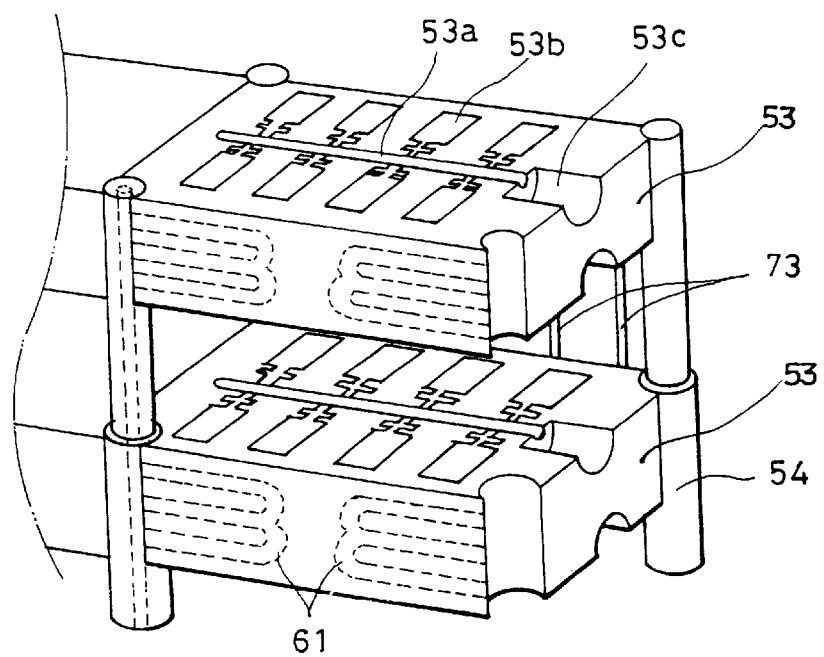
FIG. 8 is a perspective view showing the chase block portion of a molding apparatus according to the present invention.

The chase block will now be described with reference to FIG. 8. The chase blocks 53 are welded to the posts 54. A plurality of groove-shaped cavities 53b are formed at the upper and lower surfaces of the chase block 53. A runner 53a connects with all cavities 53b, and an inlet port 53c is formed at one end of the runner 53a. The uppermost chase block has the inlet port formed at the lower surface of the same, and the lowermost chase block has the inlet port formed at the upper surface of the same. A heater 61 is disposed within the upper chase blocks 53 and the posts 54.

Figure 9:
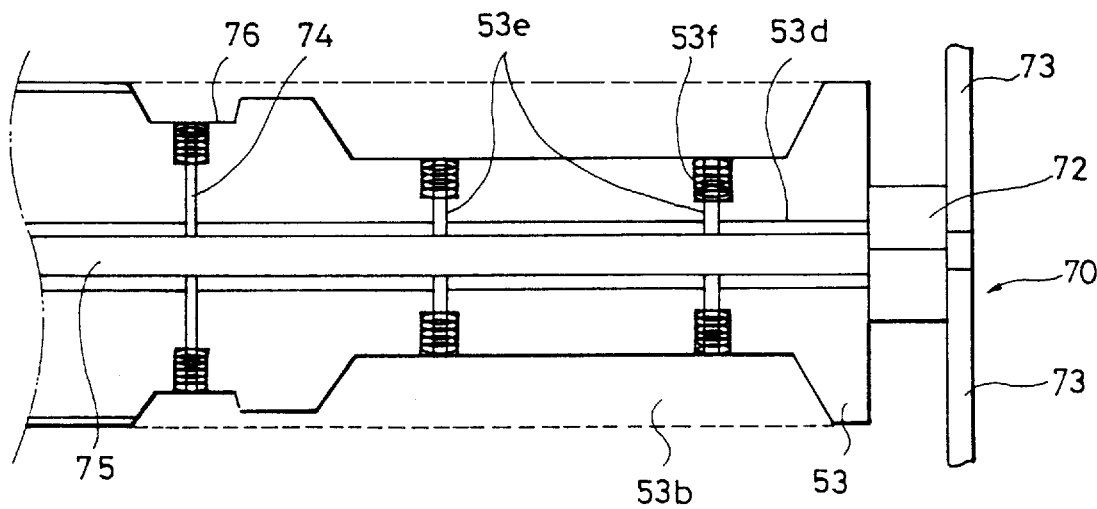
FIG. 9 is a cross-sectional view showing one side of a chase block in which an ejector is disposed according to the present invention.

FIG. 9 shows the ejecting means 70 disposed in the chase blocks 53. The chase blocks 53 include an elongated cam disposing hole 53d innerwardly extended from one side of the same to the inner side of the same. In addition, a plurality of pin disposing holes 53e are vertically formed within the chase block 53. The pin disposing holes 53e communicate with the cavities and the runners. A spring disposing groove 53f is formed at the upper end of the pin disposing holes 53e.

A cam shaft 75 has a predetermined length, and is inserted into the cam disposing hole 53d. One end of the cam shaft 75 is fixed to a predetermined portion of a connection member 72. Each end of the connecting rods 73 is connected between opposed two points of the connection member 72. In the drawings, reference numeral 74 denotes ejecting pins, and reference numeral 76 denotes a tension spring disposed at one end of the ejecting pin. The ejecting pins 74 contact with the cam shaft 75 in cooperation with the elastic force of the spring 76. The spring 76 is adapted in order for the ejecting pins 74 to elastically support the cam shaft 75. The ejecting means 70 disposed in the chase blocks 53 is positioned in the reversed direction that the lead frame is loaded.

Figure 10:
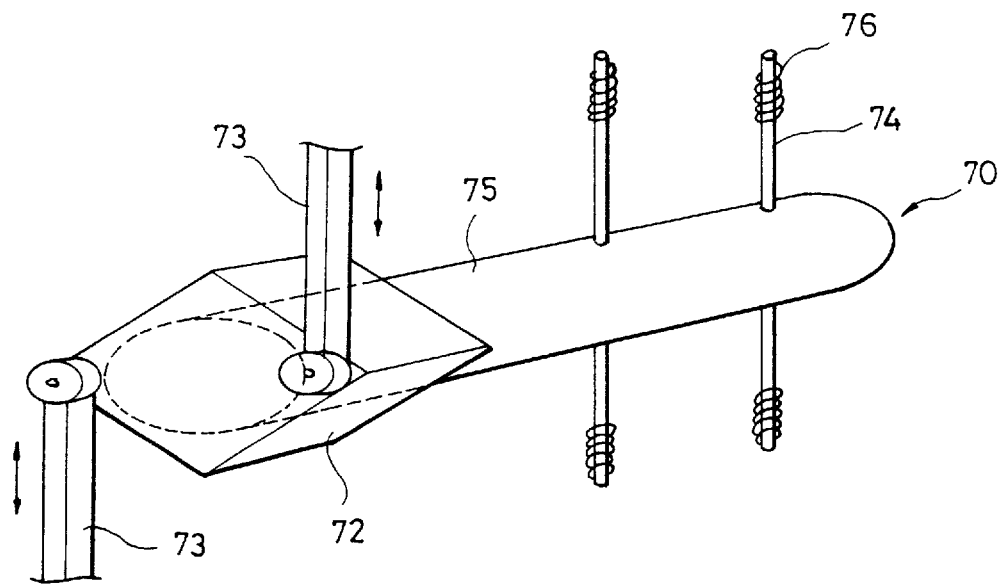
FIG. 10 is a perspective view showing an ejector according to the present invention.

As shown in FIG. 10, the cam shaft 75 of the ejecting means 70 is elliptically-shaped when viewing its side cross-sectional profile. The lower end of the ejecting pins 74 contacts with the circumferential surface of the cam shaft 75. The connecting rods 73 connected to the opposed two points of the connecting member 72 are upwardly and downwardly movable in the opposed direction, so that the rotation of the cam shaft 75 is made. The ejecting pins 74 upwardly move along the circumferential surface of the cam shaft 75, and serve to eject the molded semiconductor package.

Figure 11A:
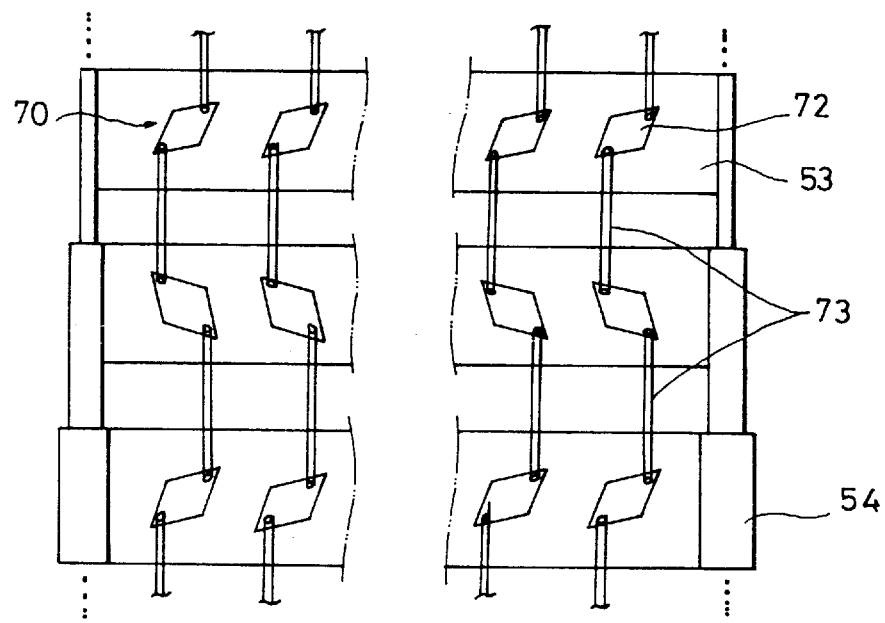
Figure 11B:
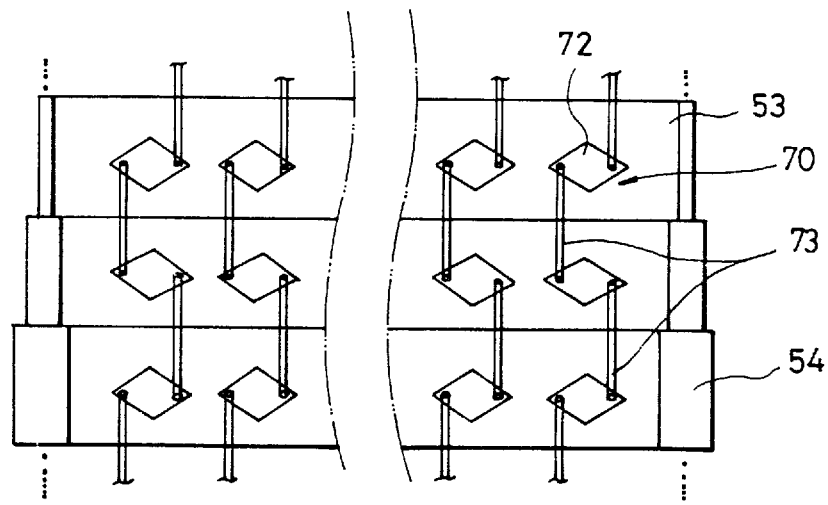

As shown in FIG. 11, a plurality of ejecting means 70 are disposed at one side of the chase block 53. Preferably, the number of the ejecting means 70 is referred to as the number of the cavities of each chase block 53. The plurality of the ejecting means 70 are connected with one another by the connecting rods 73. The ejecting means become operable when the chase blocks 53 are clamped (FIG. 11B) or opened (FIG. 11A).

First, as shown in FIG. 6A, the heater 61 disposed within the posts 54 and the chase blocks 53 is supplied with power, and then the chase blocks 53 is heated up to the moldable temperature. Thereafter, when the lower plate 51 is upwardly moved, the knobs of the posts 54 are inserted to one another for a formation of the post, and the plurality of the chase blocks 53 is clamped.

After the tablets 60 are placed on the tablet disposing holes 55b, respectively, and then power is supplied thereto. The tablet loader 55 is downwardly moved in cooperation with the rotation force of the driving motor 58. At this time, the tablet holes 55b coincide with the tablet inlet ports 53c of the chase block 53. The hydraulic set 57 is operated, and the ram assembly 56 is moved to both sides of the chase block 53. The ends of the ram assembly 56 pass through the tablet holes 55b to the inlet port 53c of the chase block 53, and push the tablet 60 into the chase block 53.

At an initial stage, the tablet 60 made of the epoxy molding compound is solid. However, the solid tablet becomes a liquid sate with the lapse of time. The liquid state of the tablet is introduced into each cavity 53b through the runner 53a. When the insertion of the tablet 60 is finished, the tablet 60 is cured, and then the chase block 53 is opened.

At this time, the knobs of the posts 54 become disassembled and upwardly moves. Concurrently, the connecting rods 73 upwardly and downwardly move, causing the cam shaft 75 to rotate. Thereafter, the ejecting pins 74 upwardly move and cause the molded semiconductor package to escape from the chase block 53.

As described above, the transfer molding apparatus of the present invention is directed to providing the molding apparatus having a plurality of laminated chase blocks, so that it is possible to increase the molding capacity of the semiconductor package, and to achieve the mass production of the semiconductor package. In addition, since the heater can be directly installed in the chase block, a desired rapid molding can be made. Since the master die is not used in the present invention, a more compact size of the system can be made and the weight of the same is reduced. Moreover, the ejecting pin is not operated by a hydraulic system which is costly and has a complicated construction in the present invention. Namely, the ejecting pin is operated by the mechanical system, so it is easy to maintain the system, and the program control process of the system is simple.

Although the preferred embodiments of the present invention have been disclosed for illustrative purposes, those skilled in the art will appreciate that various modifications, additions and substitutions are possible, without departing from the scope and spirit of the invention as described in the accompanying claims.

The foregoing embodiment is merely exemplary and not to be construed as limiting the present invention. The present scheme can be readily applied to other types of apparatuses. The description of the present invention is intended to be illustrative, and not limiting the scope of the claims. Many alternatives, modifications and variations will be apparent to those skilled in the art.

I claim:

1. A transfer molding apparatus, comprising:
    a first plate and a second plate, wherein one of the first and second plates is movable with respect the other of the first and second plates;
    a plurality of posts disposed between the first and second plates;
    a plurality of chase blocks connected to the posts, wherein the chase blocks are adapted to be moved between open and closed positions;
    a plurality of ejecting devices for ejecting molded articles from the plurality of chase blocks, wherein each ejecting device comprises a camshaft located in a chase block and at least one ejector pin that engages the camshaft, and wherein rotation of the camshaft causes movement of the at least one ejector pin.

2. The apparatus of claim 1, wherein each of said plurality of posts comprises a plurality of knobs, said knobs being insertable to one another for a formation of a post.

3. The apparatus of claim 1, wherein said plurality of ejecting devices are arranged on the apparatus at a position opposite to a position where a lead frame may be loaded in the apparatus.

4. The apparatus of claim 1, wherein the plurality of ejecting devices are concurrently operated when the chase blocks move between the open and closed positions.

5. The apparatus of claim 1, wherein at least one of said chase blocks and said posts have a heater disposed therewithin.

6. The apparatus of claim 1, wherein each ejecting device further comprises a connecting member attached to an end of the camshaft, and at least one connecting rod attached to the connecting member, and wherein movement of the connecting rod relative to the camshaft causes rotational movement of the camshaft.

7. The apparatus of claim 6, wherein each ejecting device comprises two connecting rods, and wherein the connecting rods are attached to opposite sides of the connecting member.

8. The apparatus of claim 7, wherein at least one connecting rod of the apparatus is attached to connecting members of two different camshafts disposed on two different chase blocks, respectively.

9. The apparatus of claim 7, wherein movement of the chase blocks between the open and closed positions causes rotation of the camshafts of the ejecting devices, and wherein rotation of the camshafts causes movement of the at least one ejecting pin of each of the ejecting devices.

10. The apparatus of claim 1, wherein each of said chase blocks comprises a plurality of molding cavities and at least one runner cavity that connects a plurality of the molding cavities.

11. The apparatus of claim 10, wherein the plurality of chase blocks comprise:
    a top chase block;
    a bottom chase block; and
    at least one interim chase block, and wherein a plurality of molding cavities and at least one runner cavity are formed on each of two opposing sides of the at least one interim chase block.

12. The apparatus of claim 11, wherein an inlet port is formed on at least one side of each chase block, and wherein a molding compound may be introduced to the at least one runner cavity of each chase block through the inlet port formed on the chase block.

13. The apparatus of claim 1, wherein an elongated camshaft disposing hole is formed at a predetermined depth within each chase block, and wherein a plurality of ejector pin disposing holes are formed within each chase block, the ejector pin disposing holes extending in a direction substantially perpendicular to a longitudinal axis of an associated camshaft disposing hole.

14. The apparatus of claim 13, wherein each of the ejector pin disposing holes extends from a camshaft disposing hole to one of a molding cavity and a runner cavity.

15. The apparatus of claim 14, wherein a spring accommodating aperture is formed at at least one end of each ejector pin disposing hole.

16. The apparatus of claim 1, further comprising a supplying device for supplying a molding compound to the plurality of chase blocks, wherein the supplying device comprises:
    at least one tablet loader positioned on a side of the plurality of chase blocks; and
    a ram assembly for causing a molding compound to enter the plurality of chase blocks.

17. The apparatus of claim 16, wherein said tablet loader further comprises a plurality of holes, and a gear groove, and wherein the tablet loader is intermeshed with a driving gear so as to be movable relative to the chase blocks.

18. The apparatus of claim 16, wherein the ram assembly comprises two separate rams for causing a molding compound to enter the plurality of chase blocks from opposite sides of the chase blocks.

19. The apparatus of claim 1, wherein each post comprises a plurality of sections.

20. The apparatus of claim 19, wherein each of the sections of a post are slidably engagable with another section.

21. The apparatus of claim 19, wherein at least one section of each post comprises a male end and a female end, and wherein each section of a post is movable relative to an adjoining section of the post.

22. The apparatus of claim 1, wherein the length of each of the posts varies as the chase blocks move between the open and closed positions.

* * * * *